(12) United States Patent
Nagashima et al.

(10) Patent No.: US 8,031,479 B2
(45) Date of Patent: Oct. 4, 2011

(54) POWER CONVERTER APPARATUS

(75) Inventors: Takashi Nagashima, Aichi-ken (JP); Hiroyuki Onishi, Aichi-ken (JP); Toshiaki Nagase, Kariya (JP); Jun Ishikawa, Kariya (JP); Kazuyoshi Kontani, Kariya (JP); Toshinari Fukatsu, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 368 days.

(21) Appl. No.: 12/397,191

(22) Filed: Mar. 3, 2009

(65) Prior Publication Data

US 2009/0251875 A1 Oct. 8, 2009

(30) Foreign Application Priority Data

Mar. 4, 2008 (JP) ................................. 2008-054048
Mar. 4, 2008 (JP) ................................. 2008-054050

(51) Int. Cl.
*H05K 7/00* (2006.01)

(52) U.S. Cl. ........ 361/781; 361/783; 361/624; 361/637; 361/611

(58) Field of Classification Search .................. 361/760, 361/781–783, 773, 774, 278, 299.1–299.3, 361/298.2, 298.4, 306.1, 622, 624, 632, 637, 361/639, 643, 648, 650, 200
See application file for complete search history.

(56) References Cited

U.S. PATENT DOCUMENTS

2006/0232942 A1* 10/2006 Nakatsu et al. ............... 361/710
2007/0051974 A1*  3/2007 Azuma et al. .................. 257/177

FOREIGN PATENT DOCUMENTS

| JP | 2002-044964 A | 2/2002 |
| JP | 2003-009546 A | 1/2003 |
| JP | 2004-214452 A | 7/2004 |
| JP | 2005-261035 A | 9/2005 |
| JP | 2005-347561 A | 12/2005 |
| JP | 06-021323 A | 1/2006 |
| JP | 06-261556 A | 9/2006 |
| JP | 2007-143272 A | 6/2007 |

* cited by examiner

*Primary Examiner* — Hoa C Nguyen
(74) *Attorney, Agent, or Firm* — Woodcock Washburn LLP

(57) ABSTRACT

A power converter apparatus that includes a substrate, plate-like positive and negative interconnection members, and capacitors is disclosed. Pairs of groups of switching elements are mounted on the substrate. Each of the positive interconnection member and the negative interconnection member has a terminal portion. The terminal portion has a joint portion that is electrically joined to a circuit pattern on the substrate. The switching elements are arranged in the same number on both sides of the joint portion of at least the positive interconnection member of the positive and negative interconnection members.

12 Claims, 11 Drawing Sheets

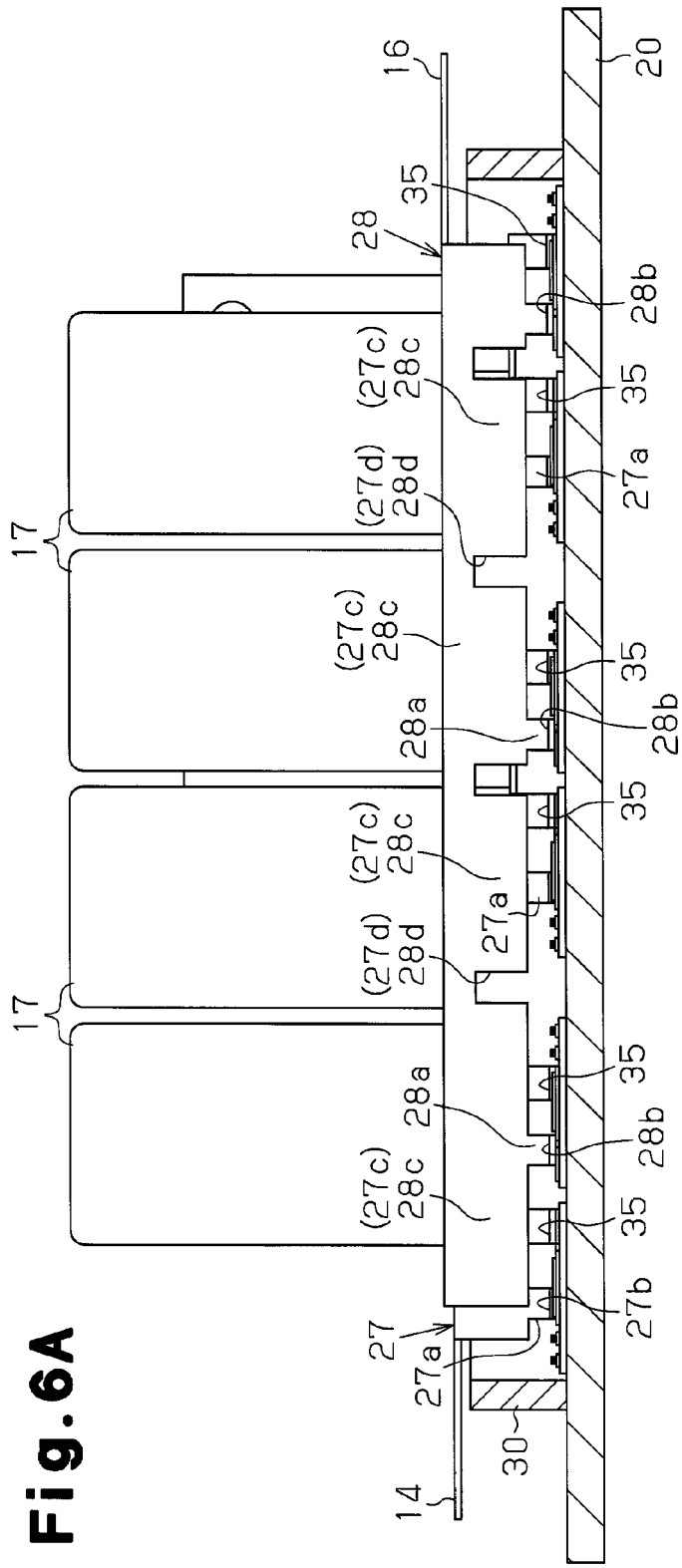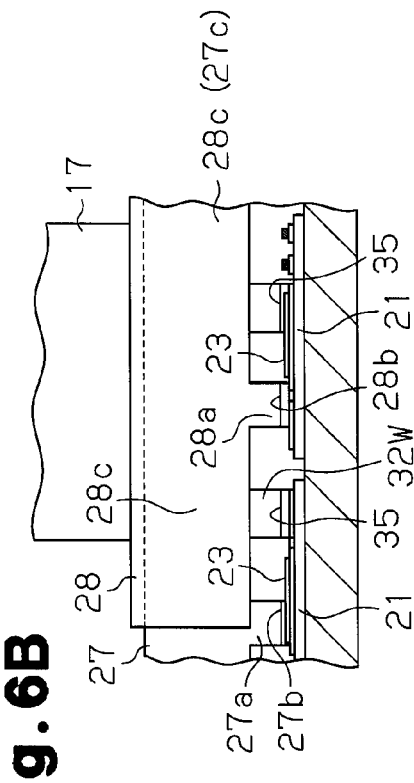

POWER CONVERTER APPARATUS

CROSS REFERENCE TO RELATED APPLICATION

This application claims priority to Japanese Patent Application Nos. 2008-054048 and 2008-054050 filed Mar. 4, 2008.

TECHNICAL FIELD

The present invention relates to a power converter apparatus.

BACKGROUND

In a semiconductor device (power semiconductor module) having a semiconductor circuit that converts an alternating current to a direct current or in a power converter apparatus (inverter apparatus) having a capacitor module that forms a DC smoothing circuit in the power semiconductor module, its interconnection inductance is required to be reduced.

Japanese Laid-Open Patent Publication No. 2005-347561 discloses a structure and a configuration that reduce the inductance in each of the internal wiring of a power semiconductor module, the internal wiring of a capacitor module, and the external wiring from the capacitor module to the semiconductor module. Specifically, as shown in FIGS. 14A and 14B, a plurality of insulated substrates 72 are provided on a base 71. A switching chip 73 and a diode chip 74 are provided on each insulated substrate 72. A P-type conductor (positive conductor) 75 and a N-type conductor (negative conductor) 76 are laminated, while being insulated from each other, on the top surface of each of the switching chip 73 and the diode chip 74. An insulation case (not shown) is arranged over the base 71 to cover the insulated substrates 72, the switching chips 73, the diode chips 74, the P-type conductor (positive conductor) 75, and the N-type conductor (negative conductor) 76. The P-type conductor 75 and the N-type conductor 76 include flat plate-like main conductors 75a, 76a and belt-like sub-conductors 75b, 76b formed at ends of the main conductors 75a, 76a, respectively. The sub-conductor 75b of the P-type conductor 75 and the sub-conductor 76b of the N-type conductors 76 are adjacent to each other while being insulated from each other, and form external terminals P2, N2, respectively. The above described publication also discloses an inverter apparatus in which a capacitor module is located on an insulation case of the a power semiconductor module. The publication further discloses an inverter apparatus having branched conductors each provided on one of the main conductors 75a and 76a of the P-type conductor 75 and the N-type conductor 76. The branched conductors connect the main conductors 75a, 76a to the capacitor element of the capacitor module.

The publication discloses a configuration in which the P-type conductor 75 and the N-type conductor 76 of the power semiconductor module are laminated while being insulated from each other, and the P-type conductor and the N-type conductor of the capacitor module are laminated while being insulated from each other, so that the inductance of the internal wiring of the power semiconductor module and the inductance of the internal wiring of the capacitor module are reduced. The publication also discloses a configuration in which the external terminals P2, N2 are formed at ends of the belt-like sub-conductors 75b, 76b, and the sub-conductors 75b, 76b are located close to and parallel with each other, so that the inductance is reduced.

In a power semiconductor module, when the amount of current through a switching element is great, a plurality of switching element connected in parallel are used instead of using a single switching element in some cases. In this case, in order to reduces the inductance of the entire internal wiring of the power semiconductor module, it is important to consider the relationship between the switching chips 73 and connecting points between circuit patterns on the insulated substrates 72 and connecting conductors 75u, 75v, 75w, 76u, 76v, 76w for supplying currents through the main conductors 75a, 76a to the circuit patterns. However, the above described publication discloses no configuration for reducing the inductance of the entire internal wiring of a power semiconductor module that uses a plurality of switching elements that are connected in parallel instead of using a single switching element.

SUMMARY

It is a first objective of the present invention to reduce the interconnection inductance of a power converter apparatus as a whole, and to level the interconnection inductance between switching elements and interconnection members in a power converter apparatus in which a plurality of switching elements collectively function as a single switching element. It is a second objective of the present invention to provide a power converter apparatus that reduces the interconnection inductance between switching elements and joint portions of the circuit patterns of interconnection members that are electrically connected to capacitors.

To achiever the foregoing objectives and in accordance with a first aspect of the present invention, a power converter apparatus including a substrate, a plate-like positive interconnection member, a plate-like negative interconnection member, and a capacitor is provided. A plurality of groups of switching elements are mounted on the substrate. The switching elements in each group collectively function as a single switching element. The positive interconnection member and the negative interconnection member are arranged to be close to and parallel with each other, while being electrically insulated from each other. The capacitor has a positive terminal electrically connected to the positive interconnection member and a negative terminal electrically connected to the negative interconnection member. Each of the positive interconnection member and the negative interconnection member has a terminal portion. The terminal portion has a joint portion that is electrically joined to a circuit pattern on the substrate. The switching elements are arranged in the same number on both sides of the joint portion of at least the positive interconnection member of the positive and negative interconnection members.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 6A is a cross-sectional view taken along line 6A-6A in FIG. 3;

FIG. 6B is a partially enlarged view of FIG. 6A;

DETAILED DESCRIPTION OF ILLUSTRATIVE EMBODIMENTS

A three-phase inverter apparatus 11 according to a first embodiment of the present invention will now be described with reference to FIGS. 1A to 9.

Figure 1A:
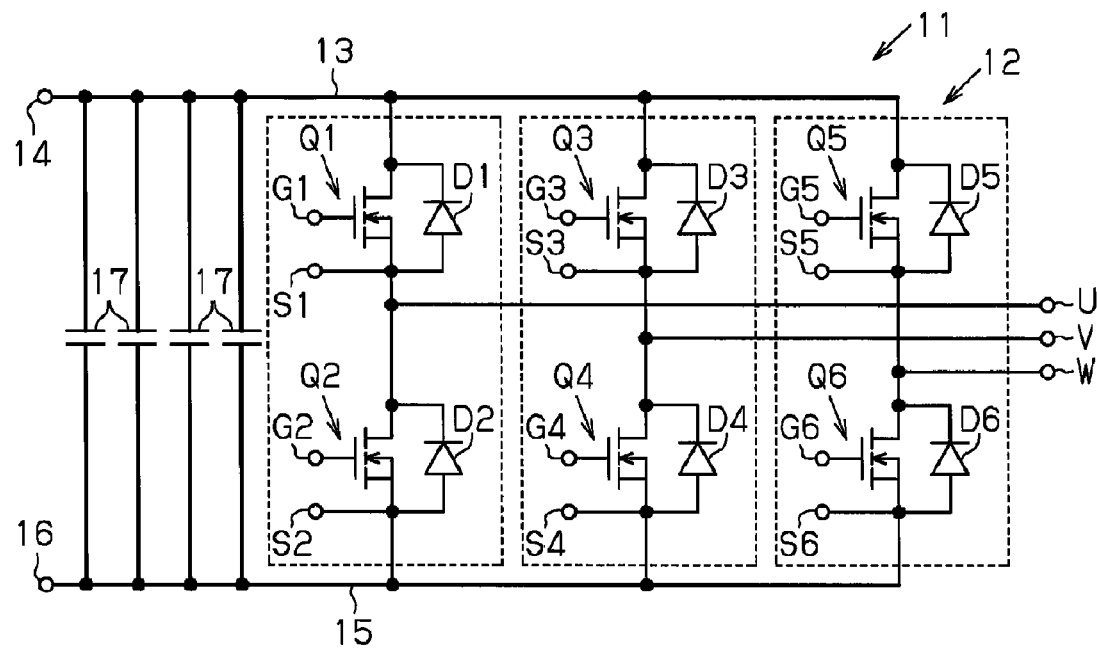
FIG. 1A is a circuit diagram showing an inverter apparatus, which is a power converter apparatus according to one embodiment of the present invention.

First, the circuit configuration of the inverter apparatus 11 will be described. As shown in FIG. 1A, the inverter apparatus 11 has an inverter circuit 12 with six switching elements Q1 to Q6. MOSFETs (metal-oxide-semiconductor field-effect transistors) are used as the switching elements Q1 to Q6. In each of the pair of the first and second switching elements Q1, Q2, the pair of the third and fourth switching elements Q3, Q4, and the pair of the fifth and sixth switching elements Q5, Q6, the switching elements are connected in series. Diodes D1 to D6 are connected in inverse parallel with a part between the drain and the source of the switching elements Q1 to Q6, respectively. Each of the switching elements Q1, Q3, Q5 and the corresponding one of the diodes D1, D3, D5 connected thereto form a structure that is referred to as an upper arm. Also, each of the second, fourth, and sixth switching elements Q2, Q4, Q6 and the corresponding one of the diode D2, D4, D6 connected thereto form a structure that is referred to as a lower arm.

The drains of the switching elements Q1, Q3, Q5 are connected to a positive input terminal 14 for inputting power through a line 13, and the sources of the switching elements Q2, Q4, Q6 are connected to a negative input terminal 16 for inputting power through a line 15. A plurality of capacitors 17 are connected in parallel between the line 13 and the line 15. In the present embodiment, electrolytic capacitors are used as the capacitors 17. The positive terminals and the negative terminals of the capacitors 17 are connected to the line 13 and the line 15, respectively.

The node between the switching elements Q1, Q2 is connected to a U-phase terminal U, the node between the switching elements Q3, Q4 is connected to a V-phase terminal V, and the node between the switching elements Q5, Q6 is connected to a W-phase terminal W. The gates of the switching elements Q1 to Q6 are connected to drive signal input terminals G1 to G6, respectively. The sources of the switching elements Q1 to Q6 are connected to signal terminals S1 to S6, respectively.

Figure 1B:
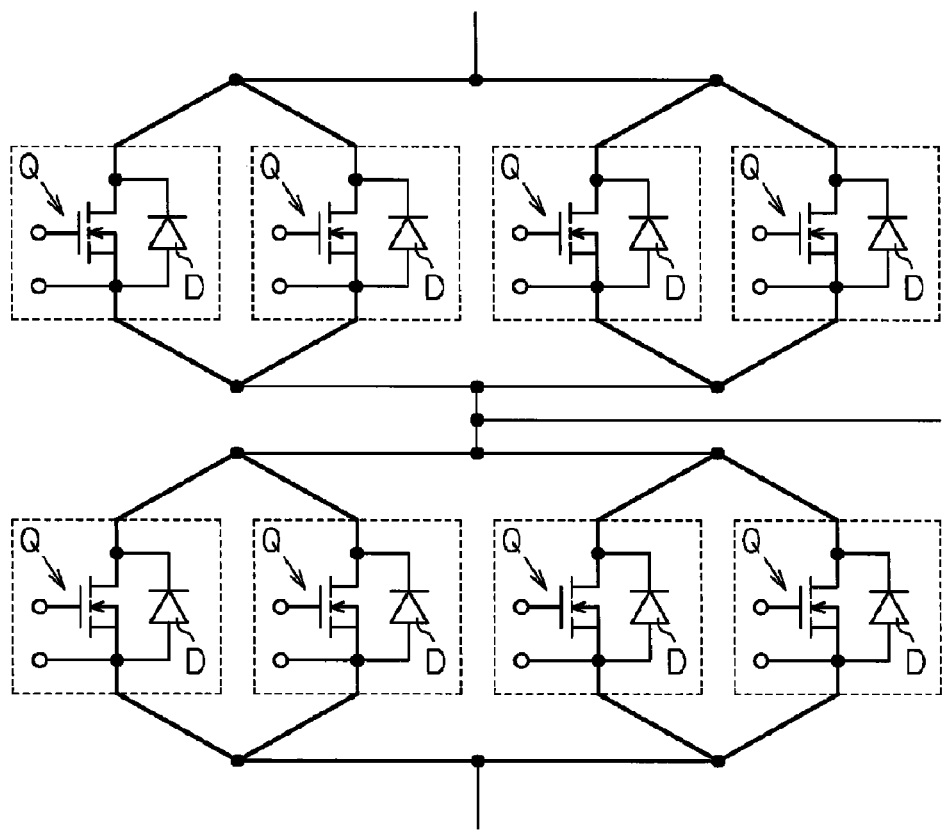
FIG. 1B is a circuit diagram showing a modification of the arms of the inverter apparatus shown in FIG. 1A.

In FIG. 1A, each of the upper arms and the lower arms includes one switching element and one diode. However, in a case where the amount of current through each arm is great, each arm may be configured with a plurality of parallel connected pairs of switching elements Q and diodes D as shown in FIG. 1B. In the present embodiment, each arm is formed by four pairs of a switching element Q and a diode D. That is, each arm includes a plurality of switching elements, which collectively have the same function as a single switching element.

The structure of the inverter apparatus 11 will now be described.

Figure 2:
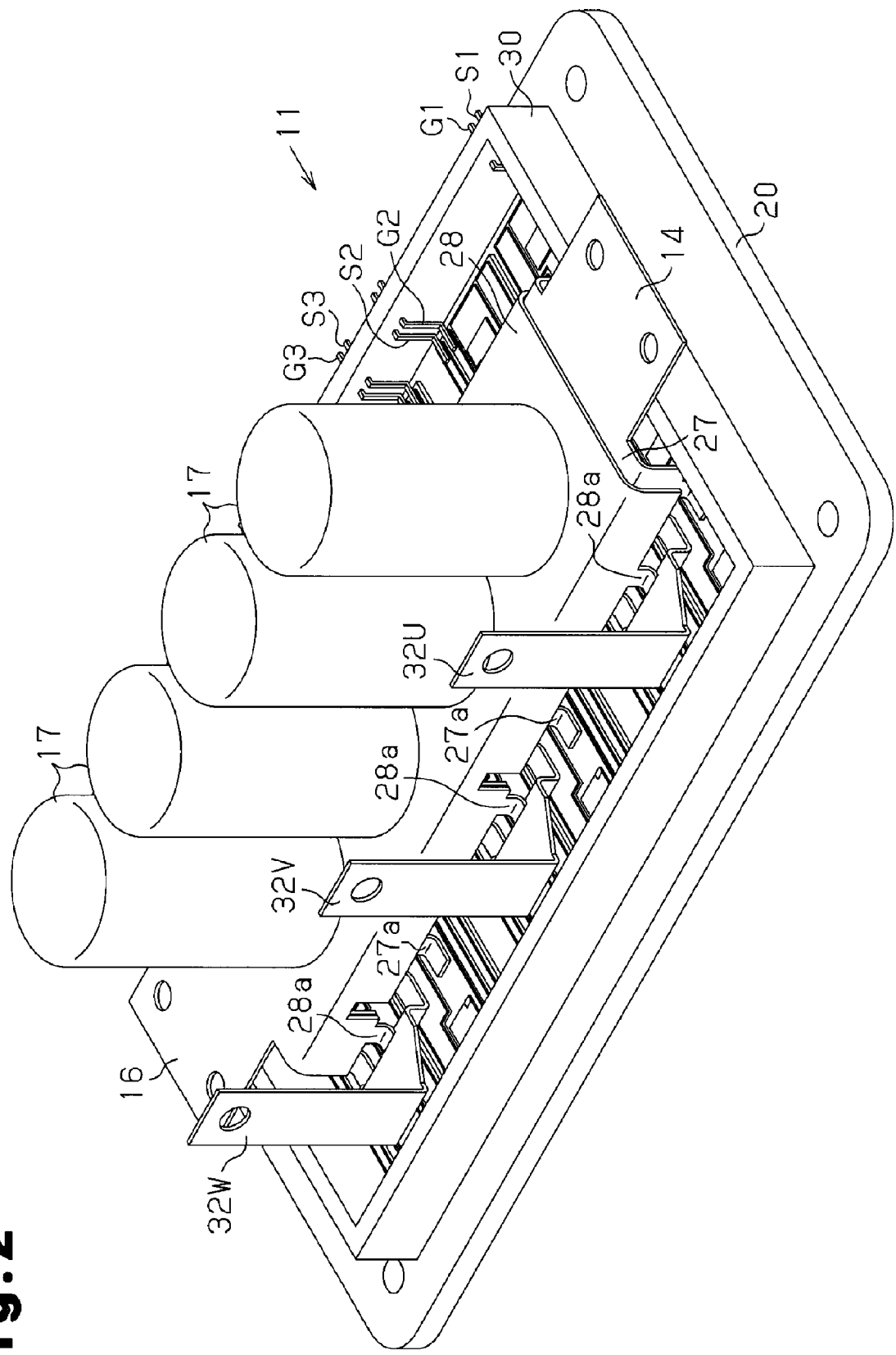
FIG. 2 is a schematic perspective view showing the inverter apparatus of FIG. 1A, from which the cover is omitted.
Figure 3:
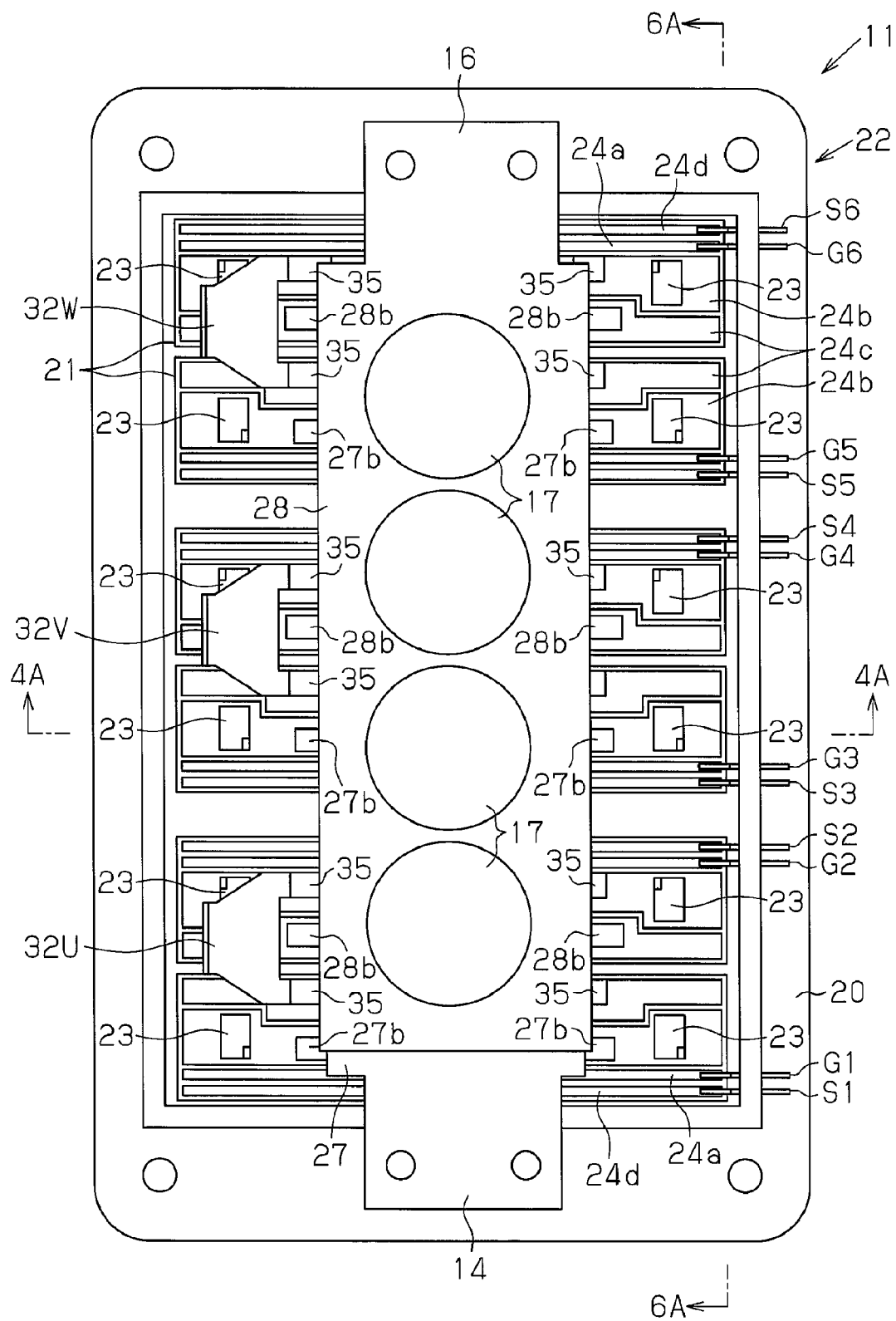
FIG. 3 is a plan view showing the inverter apparatus of FIG. 2.

As shown in FIGS. 2 and 3, the inverter apparatus 11 includes a substrate 22 formed by a metal base 20 made of copper and a plurality of ceramic substrates 21, which are insulated substrates. Semiconductor chips 23 are mounted on the substrate 22. Each semiconductor chip 23 incorporates one switching element (MOSFET) and one diode, which form a single device. That is, each semiconductor chip 23 corresponds to one of the devices provided with a single switching element Q and a single diode D shown in FIG. 1B.

Each ceramic substrate 21 has a ceramic plate 26, which is formed of, for example, aluminum nitride, alumina, or silicon nitride. As shown in FIG. 5, circuit patterns 24a, 24b, 24c, 24d are formed on the upper surface of the ceramic plate 26. As shown in FIG. 4B, a metal plate 25 is provided on the lower surface of the ceramic plate 26. The circuit patterns 24a, 24b, 24c, 24d and the metal plate 25 are made of, for example, aluminum or copper. The metal plate 25 functions as a joining layer that joins the ceramic substrates 21 and the metal base 20 with each other. The ceramic substrates 21 are joined to the metal base 20 with the metal plates 25 in between using solder (not shown). Hereinafter, the metal base 20 is referred to a bottom portion (lower portion) of the inverter apparatus 11.

As shown in FIG. 5, the circuit patterns 24a, 24b, 24c, and 24d are circuit patterns for gate signals, drains, sources, and source signals, respectively. Each of the circuit patterns 24a to 24d is formed like a belt. The drain circuit pattern 24b and the source circuit pattern 24c are adjacent to and parallel with each other. The gate signal circuit pattern 24a and the source signal circuit pattern 24d are located opposite to the circuit pattern 24c and parallel with the circuit pattern 24b. The semiconductor chips 23 joined to the drain circuit pattern 24b with solder. That is, the substrate 22 includes circuit patterns 24b, 24c, on each of which a switching element is mounted. Each circuit pattern 24b serves as a first area to which the drain of the corresponding switching element is connected. Each circuit pattern 24c serves as a second area to which the source of the corresponding switching element is connected. The gates of the semiconductor chips 23 and the gate signal circuit pattern 24a are electrically connected to each other by wire bonding. The sources of the semiconductor chips 23 are electrically connected to the source circuit patterns 24c and the source signal circuit patterns 24d by wire bonding.

Figure 7A:
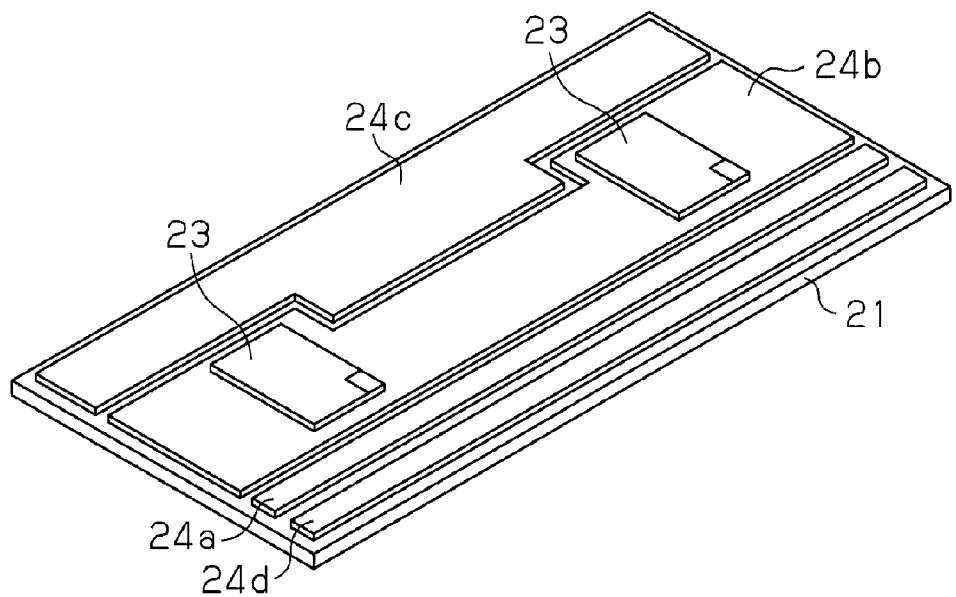
FIG. 7A is a schematic perspective view illustrating a ceramic substrate on which chip parts in the inverter apparatus of FIG. 1A are mounted.
Figure 7B:
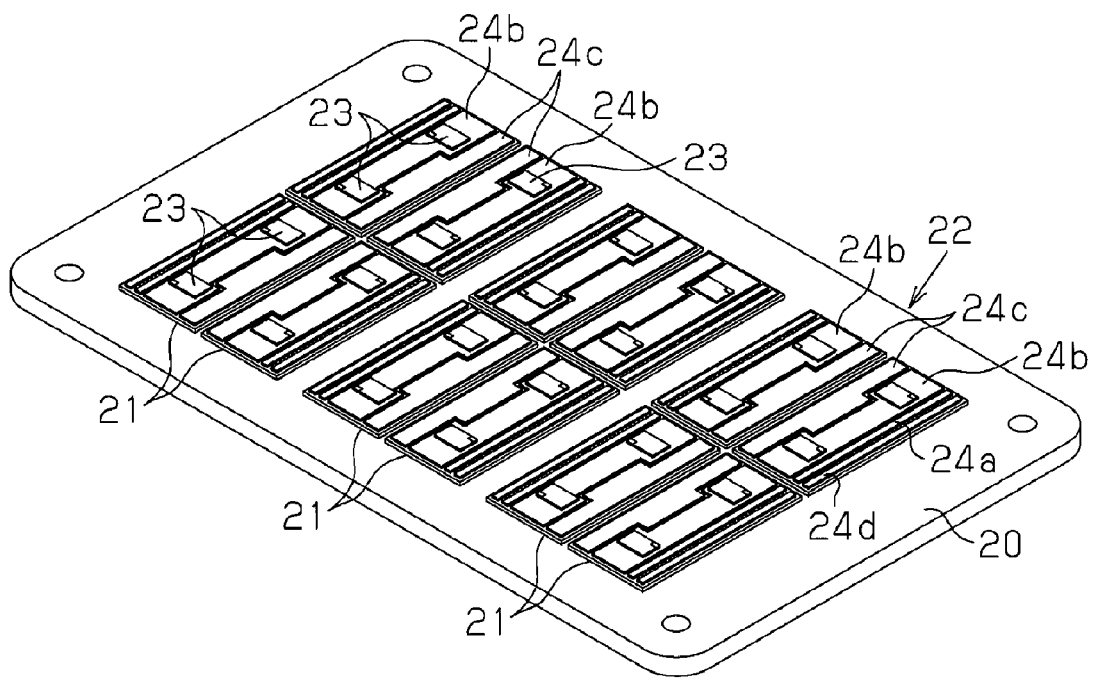
FIG. 7B is a schematic perspective view illustrating a metal base on which the ceramic substrate of FIG. 7A is mounted.

As shown in FIG. 7B, the metal base 20 is substantially rectangular. Twelve ceramic substrates 21 are provided on the metal base 20 and are arranged in six rows and two columns, such that the longitudinal direction of the ceramic substrates 21 is perpendicular to the longitudinal direction of the metal base 20. The semiconductor chips 23 on two ceramic substrates 21 on each row form an arm of the inverter circuit 12. In the present embodiment, two semiconductor chips 23 are mounted on each ceramic substrate 21, and the four semiconductor chips 23 on the two ceramic substrate 21 in each row form one arm. That is, a plurality of groups of switching elements are mounted on the substrate 22, and each group corresponds to one set of switching elements (semiconductor chips 23), which collectively have the same function as a single switching element. As shown in FIG. 5, the two semiconductor chips 23 on each ceramic substrate 21 are arranged at ends in the longitudinal direction of the circuit pattern 24b, so that a space exists between the semiconductor chips 23.

Figure 4A:
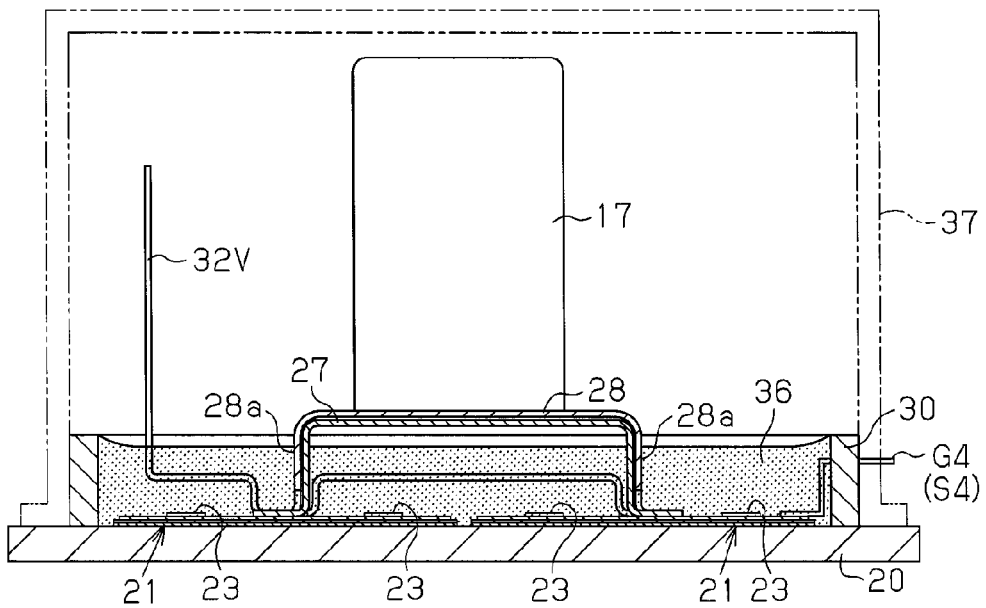
FIG. 4A is a cross-sectional view taken along line 4A-4A in FIG. 3.
Figure 4B:
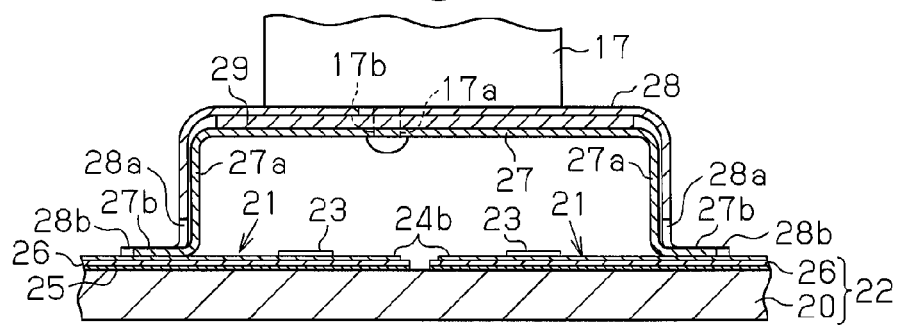
FIG. 4B is a partially enlarged view of FIG. 4A, from which a part is omitted.
Figure 5:
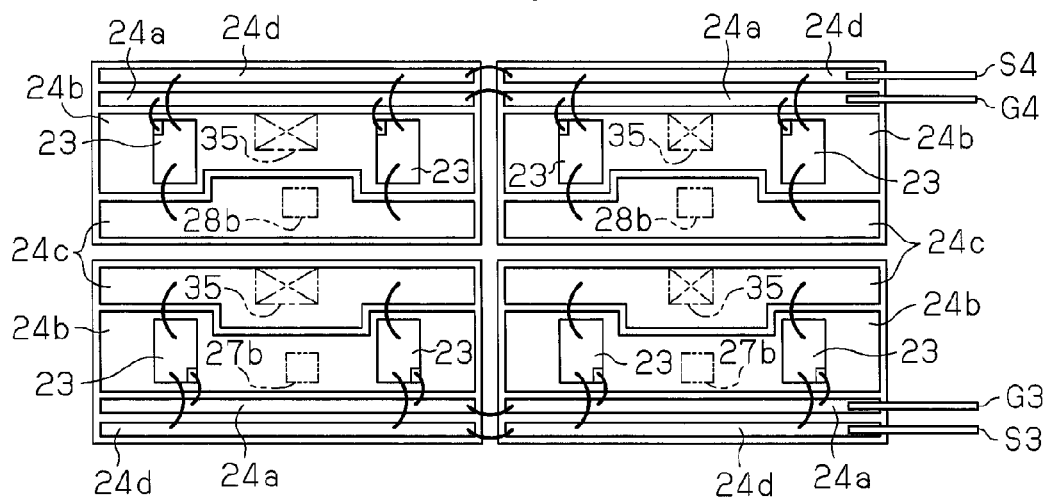
FIG. 5 is a partial plan view showing the connection state on the substrate of the inverter apparatus of FIG. 1A.

As shown in FIGS. 3, 4A, and 4B, a plate-like positive interconnection member 27 and a plate-like negative interconnection member 28 are located on the substrate 22 while being stacked and close to each other. Specifically, the positive interconnection member 27 and the negative interconnection member 28 are parallel with the substrate 22 and insulated from each other. In the present embodiment, the negative interconnection member 28 is located over the positive interconnection member 27. The positive interconnection member 27 forms the line 13, and the negative interconnection member 28 forms the line 15. The positive interconnection member 27 has a plurality of (three pairs of, that is, six in the present embodiment) terminal portions 27a that extend from ends of the positive interconnection member 27 toward the substrate 22. At is distal end, each terminal portion 27a is joined by ultrasonic bonding to a center of the drain circuit pattern 24b on the ceramic substrate 21 having the semiconductor chip 23 forming an upper arm. That is, switching elements (semiconductor chips 23) are provided in the same number on both sides of each joint portion 27b of the positive interconnection member 27. The negative interconnection member 28 has a plurality of (three pairs of, that is, six in the present embodiment) terminal portions 28a that extend from ends of the negative interconnection member 28 toward the substrate 22. Each terminal portion 28a is joined by ultrasonic bonding to a center of the source circuit pattern 24c on the ceramic substrate 21 having the semiconductor chip 23 forming a lower arm.

That is, each arm has two joint portions 27b of the positive interconnection member 27 and two joint portions 28b of the negative interconnection member 28. Two semiconductor chips (switching elements) 23 are mounted on each circuit pattern 24b, on which one of the joint portions 27b of the positive interconnection member 27 is provided.

More specifically, the terminal portions 27a, 28a are located on both ends of the positive interconnection member 27 and the negative interconnection member 28 in the widthwise direction as shown in FIG. 4B, so as to be substantially symmetric with respect to a line extending along the center in the widthwise direction. The "substantially symmetric" state is not restricted to the complete symmetric state, but may include states where there is displacement due to manufacturing tolerance and displacement due to restrictions on the arrangement of the positive interconnection member 27 and the negative interconnection member 28. For example, the "substantially symmetric" state allows displacement of 1 mm or less. That is, the positive interconnection member 27 and the negative interconnection member 28 are substantially symmetrical with respect to a center line in the widthwise direction. The terminal portions 27a, 28a are bent from the ends in the widthwise direction of the positive interconnection member 27 and the negative interconnection member 28 toward the substrate 22, and extend parallel with and are joined to the substrate 22. The terminal portions 27a, 28a are joined by ultrasonic bonding to the substrate 22 at the joint portions 27b, 28b. The joint portions, which are on the same side of the interconnection members 27, 28 in the widthwise direction, that is, joint portions between the terminal portions 27a, 28a and the circuit patterns 24b, 24c that are joined by ultrasonic bonding are located on a single straight line. That is, each arm has four switching elements (semiconductor chips 23). Each arm also has two of the joint portions 27b, 28b of the positive interconnection member 27 and the negative interconnection member 28.

As shown in FIGS. 6A and 6B, the positive interconnection member 27 and the negative interconnection member 28 have, at the widthwise ends, downward extensions 27c, 28c, respectively. The downward extensions 27c, 28c are located above the joint portions 27b, 28b of the terminal portions 27a, 28, and are formed continuously with the joint portions 27b, 28b of the terminal portions 27a, 28a. The downward extensions 27c, 28c are arranged to overlap each other. The downward extensions 27c, 28c do not extend over the entire length of the positive interconnection member 27 and the negative interconnection member 28, but have a plurality of notches 27d, 28d, respectively. The notches 27d of the positive interconnection member 27 and the notches 28d of the negative interconnection member 28 are arranged to face each other. As shown in FIG. 4B, an insulation member 29 is located between the positive interconnection member 27 and the negative interconnection member 28. The insulation member 29 electrically insulates the positive interconnection member 27 and the negative interconnection member 28 from each other. The positive interconnection member 27, the negative interconnection member 28, and the insulation member 29 have elongated holes into which a positive terminal 17a and a negative terminal 17b of a capacitor 17 can be inserted.

A support frame 30 made of electrical insulation material is fixed to the metal base 20 to extend along the edge of the metal base 20. All the ceramic substrates 21 are accommodated in the support frame 30. The positive input terminal 14 for receiving outer power is formed at a longitudinal end of the positive interconnection member 27. The positive input terminal 14 extends to the outside of the support frame 30. The negative input terminal 16 is formed at a longitudinal end of the negative interconnection member 28, specifically, the end opposite to the positive input terminal 14. The negative input terminal 16 extends to the outside of the support frame 30.

The capacitors 17 are arranged on one of the positive interconnection member 27 and the negative interconnection member 28 that is farther from the substrate 22, that is, on the negative interconnection member 28. In the present embodiment, four capacitors 17 are arranged on the negative interconnection member 28 with electrical insulation member (not shown) in between, such that the positive terminals 17a and the negative terminals 17b face the substrate 22. The positive terminal 17a and the negative terminal 17b of each capacitor 17 are located on one side of the capacitor main body. The positive terminal 17a is connected to the positive interconnection member 27, and the negative terminal 17b is connected to the negative interconnection member 28.

As shown in FIGS. 2 and 3, three output electrode members 32U, 32V, 32W of the inverter apparatus 11 each have a portion that extends upward and a portion that extends laterally, so as to be shaped like L as viewed from the side. The upward extending portion is located close to the support frame 30, and the laterally extending portion extends perpendicular to the longitudinal direction of the positive interconnection member 27 below the positive interconnection member 27. The insulation between the positive interconnection member 27 and the output electrode members 32U, 32V, 32W is ensured by silicone gel 36 (shown in FIG. 4A).

The output electrode members 32U, 32V, 32W are each formed by pressing a copper plate the width of which is substantially equal to the width of the ceramic substrates 21. As shown, for example, in FIG. 8B, each of the output electrode members 32U, 32V, 32W has four joint portions 35. Two of the joint portions 35 are joined to substantially centers of the circuit patterns 24c of the two ceramic substrate 21 having the semiconductor chips 23 that form the upper arm. The other two are joined to substantially centers of the circuit patterns 24b of the two ceramic substrate 21 having the semiconductor chips 23 that form the lower arm. More specifically, the output electrode member 32U is joined by ultrasonic bonding to the source circuit pattern 24c of the upper arm formed by the first switching element Q1 and the diode D1, and to the drain circuit pattern 24b of the lower arm formed by the second switching element Q2 and the diode D2. The output electrode member 32V is joined by ultrasonic bonding to the source circuit pattern 24c of the upper arm formed by the third switching element Q3 and the diode D3, and to the drain circuit pattern 24b of the lower arm formed by the fourth switching element Q4 and the diode D4. The output electrode member 32W is joined by ultrasonic bonding to the source circuit pattern 24c of the upper arm formed by the fifth switching element Q5 and the diode D5, and to the drain circuit pattern 24b of the lower arm formed by the sixth switching element Q6 and the diode D6.

Figure 8A:
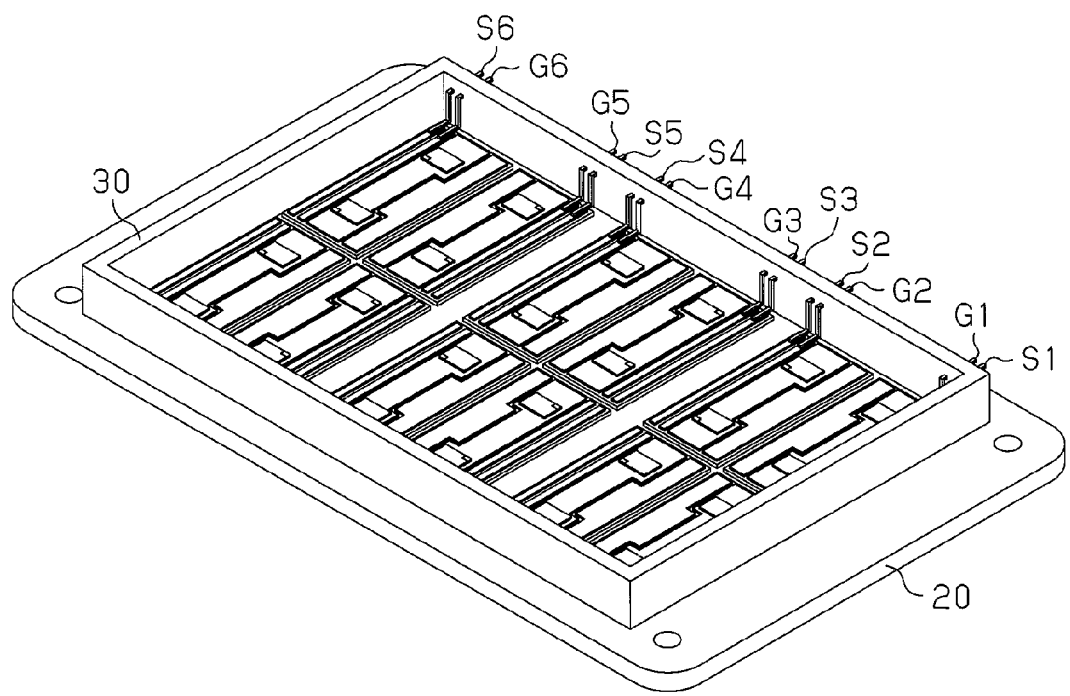
FIG. 8A is a schematic perspective view showing a state in which a support frame is attached to the metal base of FIG. 7B.
Figure 8B:
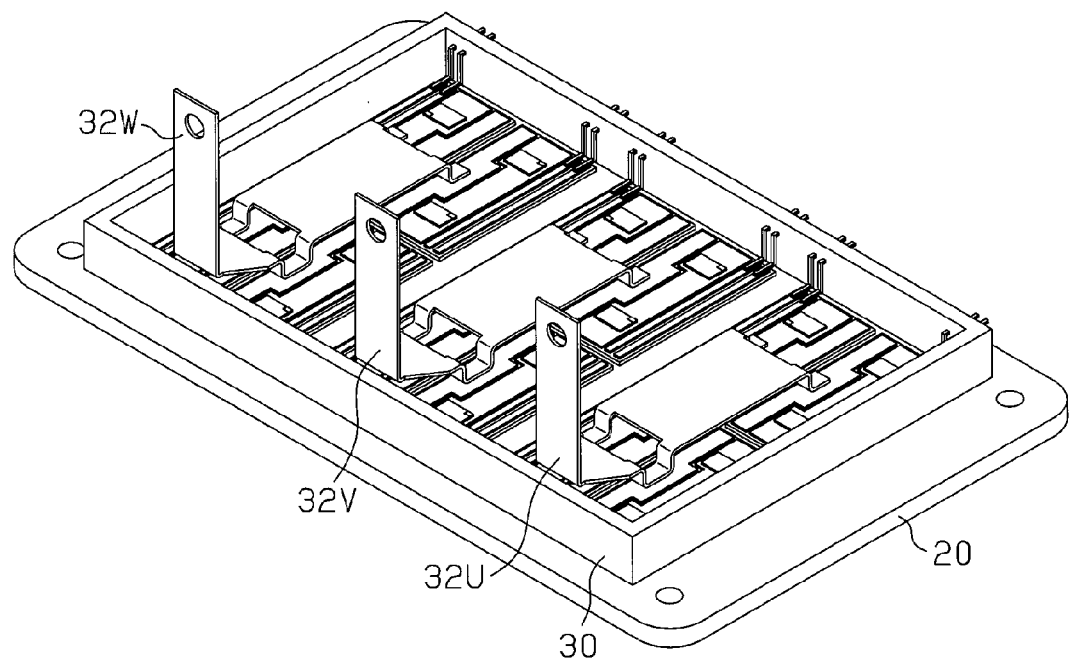
FIG. 8B is a schematic perspective view showing a state in which output electrode members are attached to the metal base of FIG. 7A.

As shown in FIG. 8B, each of the substantially L-shaped output electrode members 32U, 32V, 32W has a horizontal portion, which has a pair of the joint portions 35 at the proximal end (a part closer to the bent portion), and another pair of the join portions 35 at the distal end. The joint portions 35 extend toward the substrate 22 from the horizontal portion. A space capable of receiving the terminal portion 28a and the joint portions 28b of the negative interconnection member 28 is defined between the joint portions 35 at the proximal side and between the joint portions 35 at the distal side. As shown in FIG. 3, the pairs of the joint portions 35 and the joint portions 27b, 28b on each of the widthwise sides of the positive and negative interconnection members 27, 28 are arranged on a single line.

The relationship among the joint portions 27b of the positive interconnection member 27, the joint portions 28b of the negative interconnection member 28, and the joint portions 35 of, for example, the output electrode member 32, and the semiconductor chips 23 that correspond to one pair of an upper arm and a lower arm will be described with reference to FIG. 5. FIG. 5 shows a pair of an upper arm and a lower arm to which the output electrode member 32V is joined.

That is, in each of the two circuit patterns 24b on the two ceramic substrates 21 forming an upper arm, the joint portion 27b of the positive interconnection member 27 is joined to the center of the circuit pattern 24b and sandwiched between the two semiconductor chips 23 arranged on the circuit pattern 24b. Also, in the circuit pattern 24c on the ceramic substrate 21 having the circuit pattern 24b, the joint portion 35 of the output electrode member 32V is joined to the center of the circuit pattern 24c. On the other hand, in each of the two circuit patterns 24b on the two ceramic substrates 21 forming a lower arm, the joint portion 35 of the output electrode member 32V is joined to the center of the circuit pattern 24b and sandwiched between the two semiconductor chips 23 arranged on the circuit pattern 24b. Also, in the circuit pattern 24c on the ceramic substrate 21 having the circuit pattern 24b, the joint portion 28b of the negative interconnection member 28 is joined to the center of the circuit pattern 24c.

Of the two ceramic substrates 21 corresponding to each arm, the gate signal circuit patterns 24a and the source signal circuit patterns 24d of the ceramic substrate 21 located at the distal end of the horizontal portion of the output electrode members 32U, 32V, 32W are connected to the drive signal input terminals G1 to G6 and the signal terminals S1 to S6, respectively. The terminals G1 to G6 and S1 to S6 are integrally molded with the support frame 30 so as to extend through the support frame 30, so that second ends project from the support frame 30. The circuit patterns 24a formed on the two ceramic substrates 21 of each arm are electrically connected to each other by wire bonding. Also, the circuit patterns 24d formed on the two ceramic substrates 21 of each arm are electrically connected to each other by wire bonding.

The support frame 30 is filled with the silicone gel 36, which is then cured to insulate and protect the semiconductor chips 23. A cover 37 may be fixed to the metal base 20 with bolts to cover the surface of the substrate 22 on which the semiconductor chips 23, or the switching elements Q1 to Q6 are mounted, the positive interconnection member 27, the negative interconnection member 28, the capacitors 17, the output electrode members 32U, 32V, 32W, the support frame 30.

A method for manufacturing the inverter apparatus 11, which is constructed as above, will hereafter be described.

First, a step for mounting the semiconductor chips 23 on the ceramic substrates 21 will be described. In this step, as shown in FIG. 7A, two semiconductor chips 23 are joined by soldering to the drain circuit pattern 24b on a ceramic substrate 21 such that a space exists in a center in the longitudinal direction. The gate of each semiconductor chip 23 and the gate signal circuit pattern 24a are connected to each other by wire bonding, the source of each semiconductor chip 23 and the source circuit pattern 24c are connected to each other by wire bonding, and the source of each semiconductor chip 23 and the source signal circuit pattern 24d are connected to each other by wire bonding.

Next, a step for joining ceramic substrate 21 to the metal base 20 will be described. In this step, as shown in FIG. 7B, the ceramic substrates 21 on which the semiconductor chips 23 are mounted are joined by soldering to the metal base 20 in six rows and two columns. The circuit pattern 24a and the circuit pattern 24d of each ceramic substrates 21 having the arms are electrically connected by wire bonding to the circuit pattern 24a and the circuit pattern 24d of another ceramic substrate 21 having the arms, respectively.

Next, a step for joining output electrode members 32U, 32V, 32W to the ceramic substrates 21 will be described. In this step, as shown in FIG. 8A, a support frame 30 having drive signal input terminals G1 to G6 and signal terminals S1 to S6 is fixed to the metal base 20 so as to encompass the ceramic substrates 21. The support frame 30 is fixed by means of adhesive or screws. Then, as shown in FIG. 8B, the output electrode members 32U, 32V, 32W are arranged such that each joint portion 35 contacts a substantially center of one of the drain circuit pattern 24b and the source circuit pattern 24c. Subsequently, the joint portions 35 are successively joined by ultrasonic bonding to the circuit patterns 24b and the circuit patterns 24c. Also, the first ends of the drive signal input terminals G1 to G6 are joined to the circuit patterns 24a by ultrasonic bonding, and the first ends of the signal terminals S1 to S6 are joined to the circuit patterns 24d by ultrasonic bonding.

Then, a step for assembling a capacitor assembly 38 is performed. In this step, four capacitors 17 are fixed along a single line at predetermined intervals using a jig, such that the positive terminals 17a and the negative terminals 17b face upward. Then, a negative interconnection member 28 is fixed to the negative terminals 17b of the capacitors 17 with insulating material in between. Subsequently, a positive interconnection member 27 is fixed to the positive terminals 17a of the capacitors 17 while placing an insulation member 29 between the positive interconnection member 27 and the negative interconnection member 28. In this manner, the capacitor assembly 38 is assembled such that the positive interconnection member 27 and the negative interconnection member 28 are insulated from each other, and that the positive interconnection member 27 and the negative interconnection member 28 are electrically connected to the positive terminals 17a and the negative terminals 17b of the capacitors 17, respectively.

Figure 9:
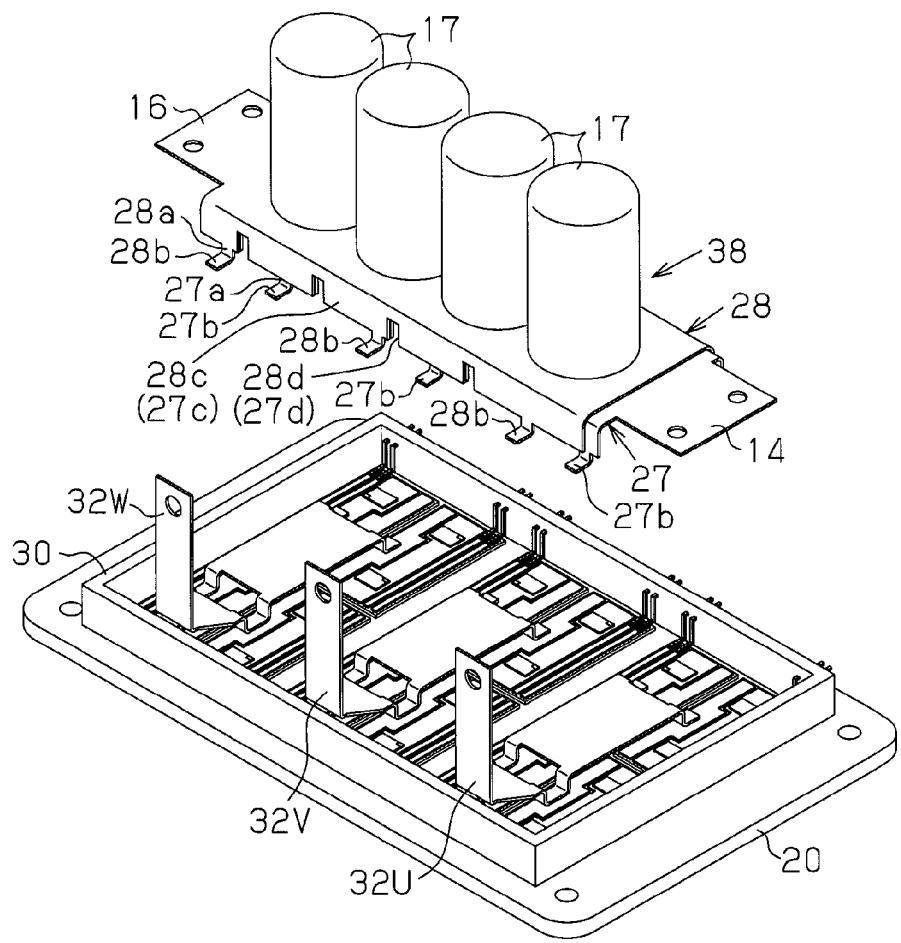
FIG. 9 is a schematic perspective view showing the relationship among the capacitor assembly, the metal base, the support frame, and the output electrode members in the inverter apparatus of FIG. 1A.

Next, a step for joining by ultrasonic bonding the capacitor assembly 38 to the ceramic substrates 21 will be described. In this step, the capacitor assembly 38 is first placed on the ceramic substrates 21. As shown in FIG. 9, the capacitor assembly 38 is arranged at a predetermined position in the support frame 30 from above the ceramic substrates 21. At this time, as shown in FIG. 3, the joint portions 27b, 28b on the same side of the interconnection members 27, 28 in the widthwise direction are located on a single line.

Thereafter, the terminal portions 27a, 28a are successively joined to the circuit patterns 24b, 24c at the joint portions 27b, 28b by ultrasonic bonding. The joint portions 27b, 28b are close to the capacitors 17. Thus, if general capacitors in which the heat resistance is not particularly considered are used as the capacitors 17, and soldering is used to join the terminal portions 27a, 28a, the heat accompanying the soldering can adversely affect the capacitors 17. However, since the joint portions 27b, 28b and the circuit patterns 24b, 24c are joined by ultrasonic bonding, the amount of heat applied to the capacitors 17 is less than the case where soldering is performed. Thus, special capacitors with enhanced heat resistance are not required.

To electrically insulate and protect portions that should be kept away from moisture and oxidation, for example, the semiconductor chips 23 and joint portions, the support frame 30 is filled with silicone gel 36, which is then cured. The downward extensions 27c, 28c of the positive interconnection member 27 and the negative interconnection member 28 have notches 27d, 28d, respectively. Compared to the case where no notches 27d, 28d are provided, the silicone gel 36 easily flows into the space between the positive interconnection member 27 and the negative interconnection member 28. Consequently, the cover 37 is fixed to the metal base 20 with bolts, so that the inverter apparatus 11 is completed.

Functions of the inverter apparatus 11 having the above construction will now be described.

The inverter apparatus 11 is, for example, a part of the power supply unit of a vehicle. In the inverter apparatus 11, the positive input terminal 14 and the negative input terminal 16 are connected to a DC power source (not shown), and the U-phase terminal U, the V-phase terminal V, and the W-phase terminal W are connected to a motor (not shown). The drive signal input terminals G1 to G6 and the signal terminals S1 to S6 are connected to a control unit (not shown).

The switching elements Q1, Q3, Q5 of the upper arm and the switching elements Q2, Q4, Q6 of the lower arm are each subjected to ON-OFF control at predetermined intervals, so that the motor is driven on AC.

At switching of the switching elements Q1 to Q6, a current that abruptly rises or a current that abruptly falls flows through the positive interconnection member 27 and the negative interconnection member 28. The flowing directions of the current in the positive interconnection member 27 and the negative interconnection member 28 are opposite to each other. Since the positive interconnection member 27 and the negative interconnection member 28 are parallel and close to each other, the inductance of the wiring is reduced by the effect of mutual inductance. Also, the downward extensions 27c, 28c are arranged to be parallel with and close to each other. This further reduces the interconnection inductance.

In each arm of the present embodiment, the circuit pattern 24b to which the drain of the semiconductor chip 23 (switching element) is electrically connected, and the circuit pattern 24c to which the source of the semiconductor chip 23 (switching element) is connected are arranged to be adjacent to and parallel with each other.

The circuit pattern 24b is connected to the joint portion 27b of the positive interconnection member 27 or the joint portion 35 of the output electrode member 32U, 32V, 32W, and the circuit pattern 24c is connected to the joint portion 35 of the output electrode member 32U, 32V, 32W or the joint portion 28b of the negative interconnection member 28.

Therefore, when the inverter apparatus 11 is operated, that is, when the switching elements are operated, the direction of current through the circuit pattern 24b and the direction of current through the circuit pattern 24c are opposite to each other, and the interconnection inductance is reduced by the mutual inductance effect.

The above illustrated embodiment has the following advantages.

(1) The inverter apparatus 11 has the substrate 22, on which a plurality of groups of switching elements are mounted, and each group corresponds to one set of switching elements (semiconductor chip 23), which collectively have the same function as a single switching element. The plate-like positive interconnection member 27 and the plate-like negative interconnection member 28, which are electrically insulated from, parallel with, and arranged close to each other, are formed on the substrate 22. The positive interconnection member 27 is electrically connected to the positive terminals 17a of the capacitors 17, and the negative interconnection member 28 is electrically connected to the negative terminals 17b of the capacitors 17. The joint portions 27b, 28b of the terminal portion 27a, 28a of the positive interconnection member 27 and the negative interconnection member 28 are electrically connected to the circuit patterns 24b, 24c on the substrate 22, and the semiconductor chips 23 are provided in the same number on each side of the joint portion 27b on each circuit pattern 24b. Therefore, in each of the circuit patterns 24b, 24c, the sum of the distances from the joint portion 27b to the respective chips 23 is less than that in the case where a plurality of semiconductor chips 23 are provided on one side of the joint portion 27b, and the distances between the joint portion 27b and the respective semiconductor chips 23 are leveled. Therefore, the interconnection inductance of the inverter apparatus 11 as a whole is reduced. Also, the interconnection inductance between the semiconductor chips 23 and the positive interconnection member 27 and the interconnection inductance between the semiconductor chips 23 and the negative interconnection member 28 are leveled.

(2) Each of the output electrode members 32U, 32V, 32W is electrically joined to the circuit patterns 24b, 24c at the joint portions 35, and the semiconductor chips 23 are arranged on both sides of the joint portion 35 in the same number on each circuit pattern 24. Therefore, in each of the circuit patterns 24b, 24c, the sum of the distances from the joint portion 35 to the respective chips 23 is less than that in the case where a plurality of semiconductor chips 23 are provided on one side of the joint portion 35, and the distances between the joint portion 35 and the respective semiconductor chips 23 are leveled. This further reduces the interconnection inductance of the inverter apparatus as a whole.

(3) The positive interconnection member 27 and the negative interconnection member 28 are arranged in a stacked state. The positive interconnection member 27 and the negative interconnection member 28 include the terminal portions 27a, 28a, which extend from the widthwise ends of the positive interconnection member 27 and the negative interconnection member 28 toward the substrate 22. The terminal portions 27a, 28a have at the distal ends the joint portions 27b, 28b, which are bent to extend parallel to the substrate 22. Therefore, compared to a case where the positive interconnection member 27 and the negative interconnection member 28 are arranged to be perpendicular to the substrate 22, the height of the entire inverter apparatus 11 is reduced. Since the terminal portions 27a, 28a are located on both sides of the positive interconnection member 27 and the negative interconnection member 28 in the widthwise direction, if the number of the semiconductor chips 23 (switching elements) is increased, the interconnection inductance of the inverter apparatus 11 as a whole is easily achieved, and the interconnection inductance between the semiconductor chips 23 and the positive interconnection member 27 and the interconnection inductance between the semiconductor chips 23 and the negative interconnection member 28 are easily leveled.

(4) The positions of the terminal portions 27a, 28a of the positive interconnection member 27 and the negative interconnection member 28 are determined such that the positive interconnection member 27 and the negative interconnection member 28 can be mounted on the substrate 22 in an upright state. Therefore, when electrically joining the positive interconnection member 27 and the negative interconnection member 28 to the circuit patterns 24b, 24c formed on the ceramic substrates 21, no jig for holding the positive interconnection member 27 and the negative interconnection member 28 against the substrate 22 or the ceramic substrates 21 is required.

(5) The positive interconnection member 27 and the negative interconnection member 28 are substantially symmetrical with respect to a line that passes through the center in the widthwise direction. Therefore, as the number of the semiconductor chips 23 (switching elements) is increased, the interconnection inductance of the inverter apparatus 11 as a whole can be easily reduced. Also, the interconnection inductance between the semiconductor chips 23 and the positive interconnection member 27 and the interconnection inductance between the semiconductor chips 23 and the negative interconnection member 28 are further easily leveled.

(6) The capacitors 17 are arranged on one of the positive interconnection member 27 and the negative interconnection member 28 that is farther from the substrate 22, that is, on the negative interconnection member 28. That is, the positive terminal 17a and the negative terminal 17b of each capacitor 17 are provided on the negative interconnection member 28 so as to face the substrate 22. Therefore, the distance between the switching elements (semiconductor chips 23) mounted on the substrate 22 and the positive and negative terminals 17a, 17b of each capacitor 17 is less than that in a case where the positive terminal 17a and the negative terminal 17b are arranged farther form the substrate 22 with respect to the capacitor. Thus, the interconnection inductance of the inverter apparatus 11 as a whole is further reduced.

(7) Each arm of the inverter apparatus 11 has switching elements (semiconductor chips 23) the number of which is represented by 4N (where N is a natural number, which is one in the first embodiment), and each arm has two of the joint portions 27b and two of the joint portions 28b of the positive and negative interconnection members 27, 28. Therefore, it is possible to further reduce the interconnection inductance of the inverter apparatus 11 as a whole, in which each arm has semiconductor chips 23 the number of which is represented by 4N. Also, the interconnection inductance between the semiconductor chips 23 and the positive interconnection member 27 and the interconnection inductance between the semiconductor chips 23 and the negative interconnection member 28 are further easily leveled. In addition, since each arm has two of the joint portions of the output electrode members 32U, 32V, 32W, the interconnection inductance of the inverter apparatus 11 as a whole is reduced.

(8) The positive interconnection member 27 and the negative interconnection member 28 are bonded to the circuit patterns 24b, 24c of the substrate 22 by ultrasonic bonding. When manufacturing the inverter apparatus 11, the positive interconnection member 27 and the negative interconnection member 28 are joined to the capacitors 17, and thereafter the joint portions 27b, 28b of the terminal portions 27a, 28a of the positive interconnection member 27 and the negative interconnection member 28 are electrically joined to the circuit patterns 24b, 24c by ultrasonic bonding. Thus, unlike the case where the joint portions 27b, 28b are joined by soldering, no special capacitors with enhanced heat resistance are required.

(9) The four joint portions 35 of each of the output electrode members 32U, 32V, 32W are located at the four corners of an imaginary rectangle. Therefore, when joining the output electrode members 32U, 32V, 32W to the ceramic substrates 21 by ultrasonic bonding, the output electrode members 32U, 32V, 32W are stably placed on the ceramic substrates 21 in an upright state. Thus, ultrasonic bonding can be performed without using a jig to holding the output electrode members 32U, 32V, 32W.

(10) On each circuit pattern 24b, at least the area to which the joint portion 27b of the positive interconnection member 27 is joined or the area (first portion) to which the joint portion 35 of, for example, the output electrode member 32U is joined is located parallel and adjacent to at least the area on the circuit pattern 24c to which the joint portion 35 of, for example, the output electrode member 32U is joined or the area to (second portion) which the joint portion 28b of the negative interconnection member 28 is joined. Therefore, when the inverter apparatus 11 is operated, that is, when the switching elements are operated, the direction of current through the circuit pattern 24b and the direction of current through the adjacent circuit pattern 24c are opposite to each other, and the interconnection inductance is reduced by the mutual inductance effect.

(11) Each circuit pattern 24b and each circuit pattern 24c are formed like belts, and a plurality of semiconductor chips 23 are mounted on each circuit pattern 24b. The sources of the semiconductor chips 23 are connected to the circuit pattern 24c by wire bonding. Therefore, compared to a case where the circuit patterns 24b, 24c are shaped like blocks instead of belts, the length of portions of the circuit patters 24b, 24c that are adjacent to each other. This increases the mutual inductance effect, and thus reduces the interconnection inductance.

(12) The power converter apparatus is an inverter apparatus, in which each arm has four switching elements. Each arm also includes the joint portions 27b of the positive interconnection member 27, the joint portions 28b of the negative interconnection member 28, and the two joint portions 35 of, for example, the output electrode member 32U. In each arm, two semiconductor chips 23 are adjacent to one joint portion 27b. Therefore, in addition to the reduction in the interconnection inductance, the interconnection inductance between the semiconductor chips 23 and the joint portions 27b are leveled even if the number of the semiconductor chips 23 (switching elements) is increased.

(13) The positive interconnection member 27 and the negative interconnection member 28 are arranged to be parallel with and overlap the substrate 22, have the terminal portion 27a, 28a projecting toward the substrate 22 from the sides at the end in the widthwise direction. The distal portions of the terminal portions 27a, 28a, which are the joint portions 27b, 28b, are bent to extend parallel with the substrate 22. The capacitors 17 are arranged on one of the positive interconnection member 27 and the negative interconnection member 28 that is farther from the substrate 22 (on the positive interconnection member 27). The positive terminal 17a and the negative terminal 17b of each capacitor 17 face the interconnection members. Therefore, in a case where the substrate 22 is used facing down, the height of the entire power converter apparatus is reduced. Also, the terminal portions 27a, 28a are provided at both sides in the widthwise direction of the positive interconnection member 27 and the negative interconnection member 28. Thus, if the number of the semiconductor chips 23 (switching elements) is great, it is easy to reduce the interconnection inductance of the power converter apparatus as a whole and to level the interconnection inductance between the semiconductor chips 23 and the interconnection members.

The present invention is not limited to the embodiments described above, but may be embodied as follows, for example.

Figure 10:
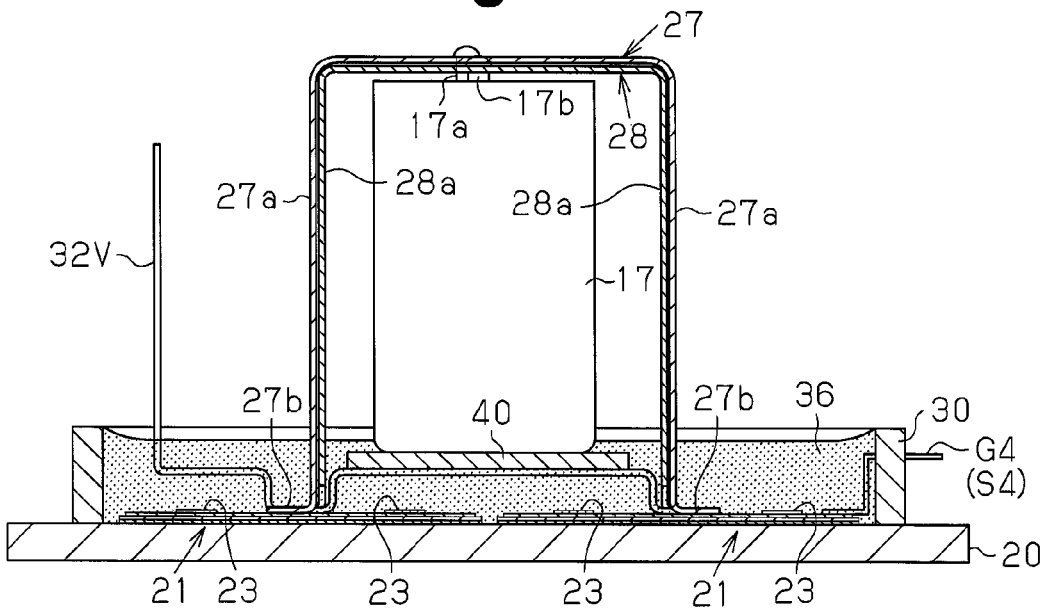
FIG. 10 is a cross-sectional view showing an inverter apparatus, which is a power converter apparatus according to a modification.

The configuration may be changed as long as the positive terminals 17a and the negative terminals 17b of the capacitors 17 are electrically connected to the positive interconnection member 27 and the negative interconnection member 28, which are arranged parallel with and close to each other while being electrically insulated from each other. That is, the positive interconnection member 27 and the negative interconnection member 28 do not need to be located between the capacitors 17 and the substrate 22. For example, the configuration shown in FIG. 10 may be employed, in which the insulation plate 40 is arranged on the output electrode members 32U, 32V, 32W, while being caused to be perpendicular to the longitudinal direction of the output electrode members 32U, 32V, 32W, and the positive terminals 17a and the negative terminals 17b are mounted on surfaces of the capacitor main bodies that are farther from the substrate 22. The positive interconnection member 27 and the negative interconnection member 28 are fixed to the positive terminals 17a and the negative terminals 17b with screws. In this case, as shown in FIG. 10, the lengths of the downward extensions 27c, 28c of the terminal portions 27a, 28a of the positive interconnection member 27 and the negative interconnection member 28 are longer than those in the case where the positive interconnection member 27 and the negative interconnection member 28 are located between the capacitors 17 and the substrate 22.

However, compared to the configuration where the capacitors 17 are located outside of the cover, the interconnection inductance is reduced.

Figure 11:
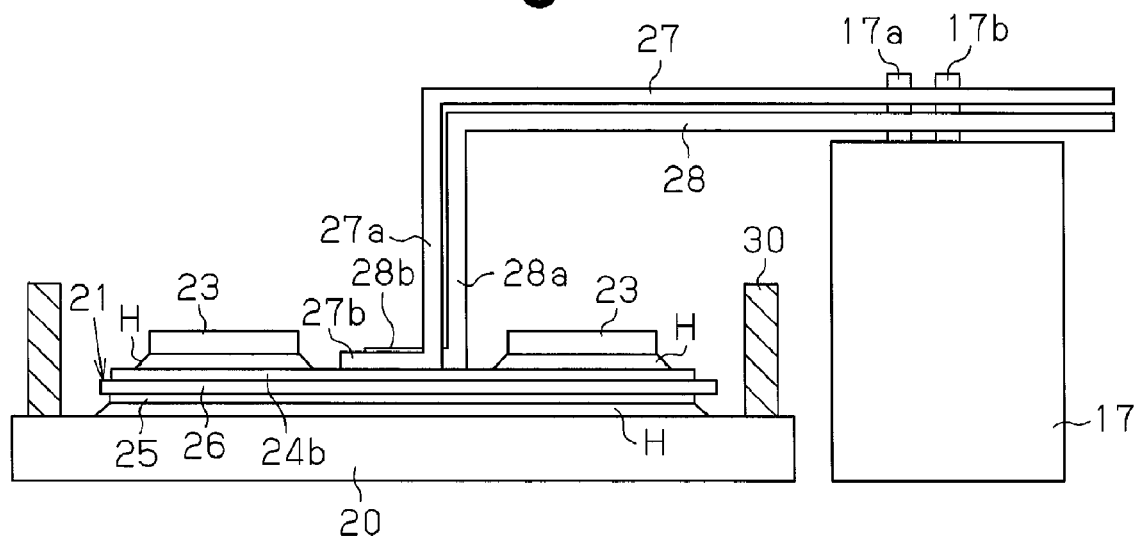
FIG. 11 is a cross-sectional view showing an inverter apparatus, which is a power converter apparatus according to a modification.

The capacitors 17 do not need to be located on the top surface of the metal base 20. For example, as shown in FIG. 11, the capacitors 17 may be located on the side of the metal base 20. The negative interconnection member 28 is arranged to be parallel with the positive interconnection member 27 so as to be closer to the capacitors 17 than the positive interconnection member 27, or to be at the lower side. Also, the joint portions 27b of the positive interconnection member 27 are joined to the drain circuit patterns 24b on the ceramic substrates 21. Further, the distal ends of the positive interconnection member 27 and the negative interconnection member 28 are bent downward toward the metal base 20, such that the joint portions 28b of the negative interconnection member 28 are joined to the source circuit patterns 24c on the ceramic substrates 21. In the embodiment shown in FIG. 11, the joint between the positive terminal 17a and the positive interconnection member 27 and the joint between the negative terminal 17b and the negative interconnection member 28 are achieved by fastening with screws, but achieved by a joining method in which the capacitor 17 is less affected by heat than in soldering. For example, precision resistance welding or laser beam welding is employed. Also, each arm has two semiconductor chips 23 mounted on one ceramic substrate 21, and six rows of ceramic substrates 21 are arranged along the direction perpendicular to the plane of FIG. 11. In FIG. 11, the circuit substrates other than the circuit pattern 24b or the output electrode member 32U are not illustrated. Since the switching elements (the semiconductor chips 23) are arranged on both sides of each joint portion 27b of the positive interconnection member 27, the interconnection inductance of the power converter apparatus as a whole is reduced, and the interconnection inductance between the switching elements and the interconnection member is leveled. In the embodiment shown in FIG. 11, since the capacitor 17 is spaced from the joints between the circuit patterns 24b, 24c and the joint portions 27b, 28b of the positive interconnection member 27 and the negative interconnection member 28, the joint between the joint portions 27b, 28b and the circuit patterns 24b, 24c does not need to be achieved by ultrasonic bonding, but may be achieved, for example, by soldering. In FIG. 11, solder H for joining the ceramic substrate 21 to the metal base 20 and solder H for joining the semiconductor chips 23 to the circuit pattern 24b are shown.

In a case where the capacitors 17 are arranged on the upper surface of the substrate 22, the configuration may be changed as long as the positive interconnection member 27 and the negative interconnection member 28 are parallel with the substrate 22 and close to each other, while being insulated from each other. That is, the negative interconnection member 28 does not need to be arranged above the positive interconnection member 27, or at a position farther from the substrate 22. The positive interconnection member 27 may be arranged above the negative interconnection member 28. However, when electrolytic capacitors are used as the capacitors 17, the negative interconnection member 28 is preferably arranged above the negative interconnection member 28 since the outer side is grounded.

In the configuration where the capacitors 17 are arranged on the upper side of the substrate 22, each arm may be formed by one ceramic substrate 21. In this case, since only one gate circuit pattern 24a is used, no wire bonding is needed to electrically connect multiple circuit patterns 24a to each other. Also, the number of joints between each drain circuit pattern 24b and the corresponding joint portions 27b of the positive interconnection member 27, and the number of joints between each source circuit pattern 24c and the corresponding joint portions 28b of the negative interconnection member 28 each may be reduced from two to one. Further, the number of joints between each drain circuit pattern 24b and the corresponding joint portions 35 of the output electrode members 32U, 32V, 32W, and the number of joints between each source circuit pattern 24c and the corresponding joint portions 35 of the output electrode members 32U, 32V, 32W each may be reduced from two to one. However, if the number of each joint is one, a jig for holding the capacitor assembly 38 and a jig for holding the output electrode members 32U, 32V, 32W are needed when performing ultrasonic bonding.

Figure 12:
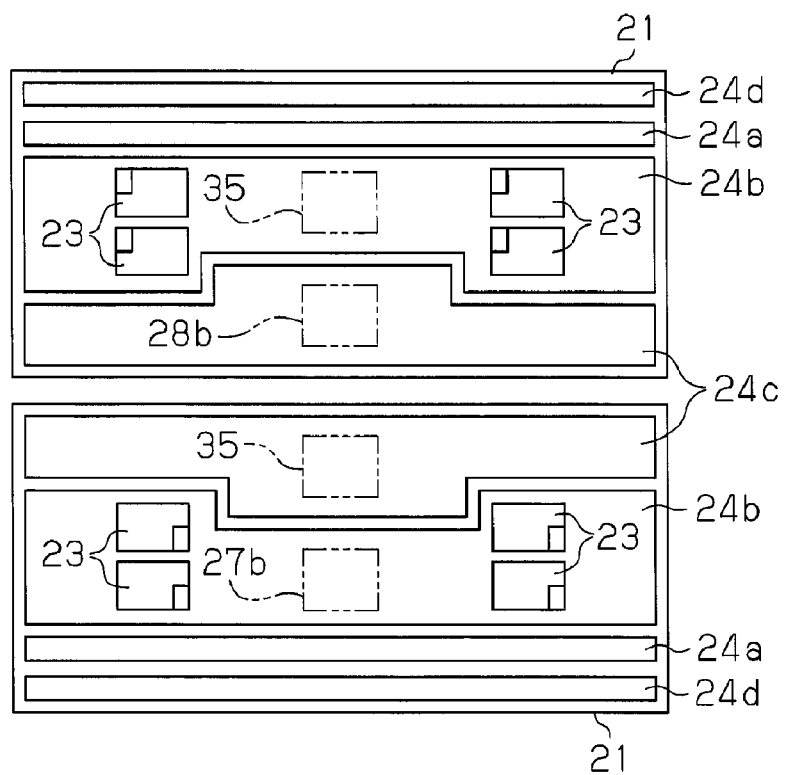
FIG. 12 is a schematic diagram showing the arrangement of semiconductor chips and joint portions in a power converter apparatus according to a modification.

The configuration in which switching elements (semiconductor chips 23) are located on the circuit pattern 24b and are provided in the same number on both sides of the joint portion 27b of the positive interconnection member 27 or on both sides of the joint portion 35 of the output electrode members 32U, 32V, 32W is not limited to the configuration in which one semiconductor chip 23 is arranged on either side of the joint portions 27b, 35. For example, as shown in FIG. 12, two or more (two in FIG. 12) semiconductor chips 23 may be arranged on each side of the joint portions 27b, 35.

The circuit patterns 24a, 24b, 24c, 24d do not necessarily have to be formed thin and parallel with each other. However, in the case where the circuit patterns 24b, 24c are shaped like blocks, a large area is required on each ceramic substrate 21 to secure a sufficient space for mounting semiconductor chips 23 on both sides of the joint portions 27b, 35 in the same number and for joining the joint portions 27b, 28b of the positive and negative interconnection members 27, 28 and the joint portions 35 of the output electrode members 32U, 32V, 32W. If the space between the circuit patterns 24b, 24c is narrow, it is difficult to join the joint portions 35 by ultrasonic bonding while maintaining the output electrode members 32U, 32V, 32W in an upright state.

Instead of reducing the number of ceramic substrates 21 forming each arm to one to reduce the number of the ceramic substrates 21, two or more arms may be formed on each ceramic substrate 21. For example, circuit patterns 24a, 24b, 24c, 24d corresponding to two or more arms may be formed on the surface of a ceramic substrate 21 having a large area. In this case, semiconductor chips 23 are mounted on each ceramic substrate 21, the joint portions 27b, 28b, 35 of the positive interconnection member 27, the negative interconnection member 28, and the output electrode members 32U, 32V, 32W are joined to the circuit patterns 24b, 24c.

The positive interconnection member 27 and the negative interconnection member 28 do not need to be symmetrical with respect to the center line in the width direction.

The metal base 20 may be formed of aluminum-based metal, and the ceramic substrates 21 may be DBA (Direct Brazed Aluminum) substrates, which has an aluminum layer on each side. In this case, the circuit patterns 24a, 24b, 24c, 24d may be formed on the front surface of the DBA substrate, and the back surface of the DBA substrate may be brazed to the metal base 20 with aluminum-based brazing filler metal.

In place of the ceramic substrates 21, metal substrates with insulation layer on the surface may be used as insulated substrates. In this case, the circuit patterns 24a, 24b, 24c, 24d may be formed on the insulation layer.

Instead of joining insulated substrates to the metal base 20 by soldering or brazing, an insulation layer may be formed on the metal base 20, and the circuit patterns 24a, 24b, 24c, 24d may be formed on the insulation layer. In this case, the number of components is reduced, and the step for joining the insulated substrates to the metal base 20 is unnecessary.

The number of the capacitors 17 is not limited to four, but may be changed to less or more than four depending on the capacitance of the rated current value of the inverter apparatus 11 and the capacitance of the capacitors.

The capacitors 17 are not limited to electrolytic capacitors, but may be, for example, electric double-layer capacitors.

The switching elements Q, Q1 to Q6 are not limited to MOSFETs, but may be other types of power transistors, such as IGBTs (Insulated-Gate Bipolar Transistors), or thyristors.

The number of pairs of the switching elements Q and the diode D in each arm is not limited to four, but may be any value as long as each arm has an even number, preferably 4N (N is a natural number) of switching elements. In the case of an even number of switching elements, the switching elements can be provided on both sides of the joint portions 27b, 35 in the same number. In the case of 4N of switching elements, the joint portion 27b, 35 are provided at two locations, so that the positive interconnection member 27 and, for example, the output electrode members 32U are easily arranged in an upright state when being joined to the ceramic substrates 21 through the joint portions 27b, 35.

The single pair of the switching element and the diode does not need to be packaged as one semiconductor chip 23, but may be independently mounted on the circuit.

Instead of three-phase AC, the inverter apparatus 11 may output single phase AC. In such a case, two pairs of upper arms and lower arms are provided.

The steps for manufacturing the inverter apparatus 11 do not need to be performed in the order described in the above embodiment. For example, the step for mounting the ceramic substrate 21 on the semiconductor chips 23 and the step for assembling the capacitor assembly 38 may be independently executed, so that a number of ceramic substrates 21 on which semiconductor chips 23 are mounted and a number of capacitor assemblies 38 are manufactured. Using these components, inverter apparatuses 11 are manufactured.

The step for joining the output electrode members 32U, 32V, 32W to the ceramic substrates 21 by ultrasonic bonding and the step for joining the capacitor assembly 38 to the ceramic substrates 21 by ultrasonic bonding may be integrated. For example, the support frame 30 has holding portions that hold the output electrode members 32U, 32V, 32W after determining the positions thereof. The metal base 20 is fixed with the output electrode members 32U, 32V, 32W held by the holding portions. Ultrasonic boding is not performed immediately thereafter, but is performed when the capacitor assembly 38 and the ceramic substrates 21 are joined to each other by ultrasonic bonding. Since the joint portions 35 of the output electrode members 32U, 32V, 32W are located on the same line as the joint portions 27b, 28b of the positive interconnection member 27 and the negative interconnection member 28. Therefore, by moving a tool for ultrasonic bonding along the interconnection members 27, 28, the tool sequentially faces each of the joint portions 27b, 28b, 35. The ultrasonic bonding is thus efficiently performed.

In the case where the ultrasonic bonding of the output electrode members 32U, 32V, 32W to the ceramic substrates 21 is performed prior to the ultrasonic bonding of the capacitor assembly 38 to the ceramic substrates 21, the joint portions 35 of the output electrode members 32U, 32V, 32W and the joint portions 27b, 28b of the positive interconnection member 27 and the negative interconnection member 28 do not need to be arranged on a single line.

Ultrasonic bonding does not need to be performed at one point (joint) at a time, but may be performed at two or more points at a time. In this case, compared to the ultrasonic bonding performed at one point at a time, the time required for completing the ultrasonic bonding for all the points to be joined is shortened. Particularly, in the case where two points are joined at a time, the ultrasonic bonding can be performed without significantly increasing the size of the ultrasonic bonding tool. Also, since the number of the points to be joined is an even number, the ultrasonic bonding performed efficiently.

The power converter apparatus does not need to be the inverter apparatus 11, but may be a DC-DC converter.

The time at which the first ends of the drive signal input terminals G1 to G6 are joined to the circuit patterns 24*a* and the first ends of the signal terminals S1 to S6 are joined to the circuit patterns 24*d* is not limited to a time before the capacitor assembly 38 is joined to the ceramic substrates 21 by ultrasonic bonding, but may be changed as long as it is after the support frame 30 is fixed to the metal base 20 and before the support frame 30 is filled with silicone gel.

Figure 13:
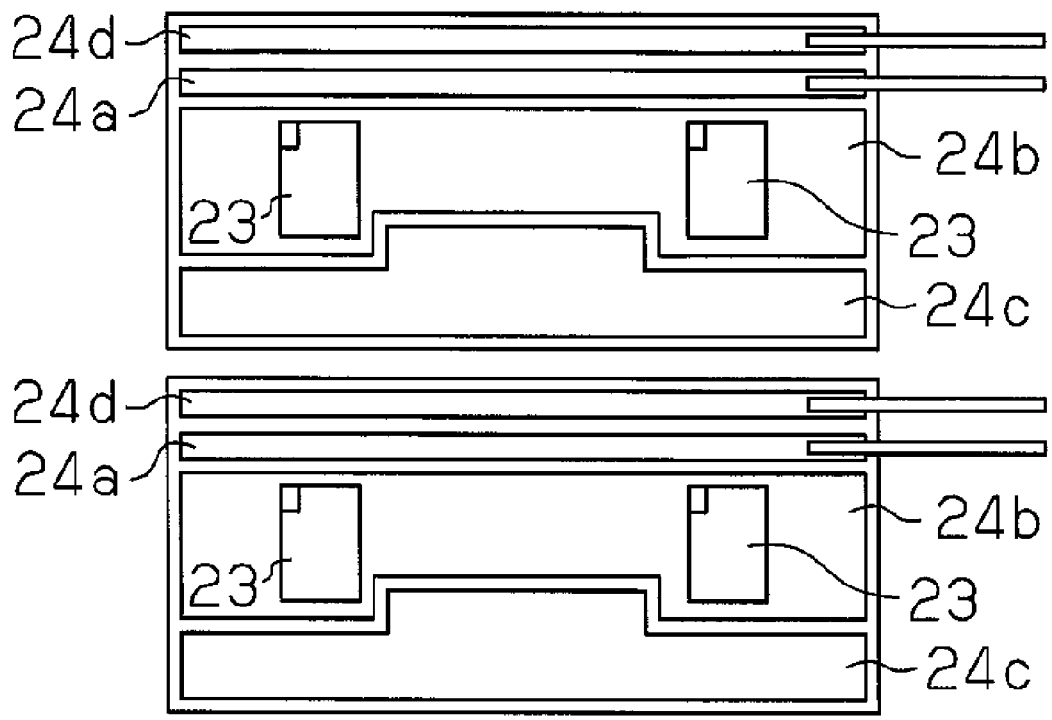
FIG. 13 is a schematic diagram showing circuit patterns on ceramic substrates of a power converter apparatus according to a modification.
Figure 14A:
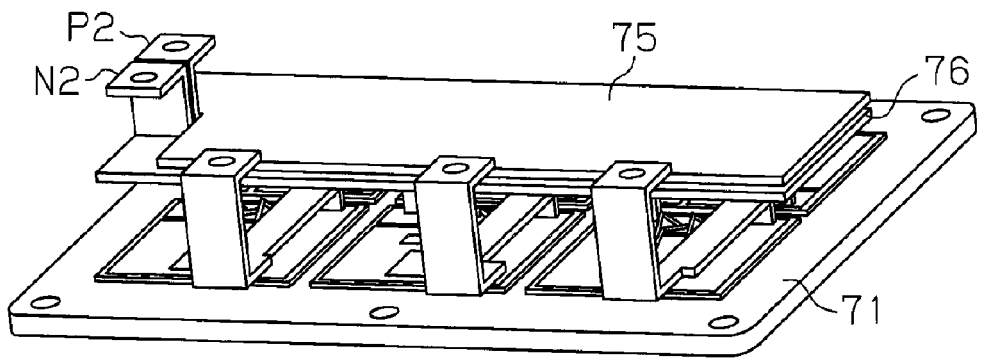
FIG. 14A is a perspective view illustrating a prior art power converter apparatus.
Figure 14B:
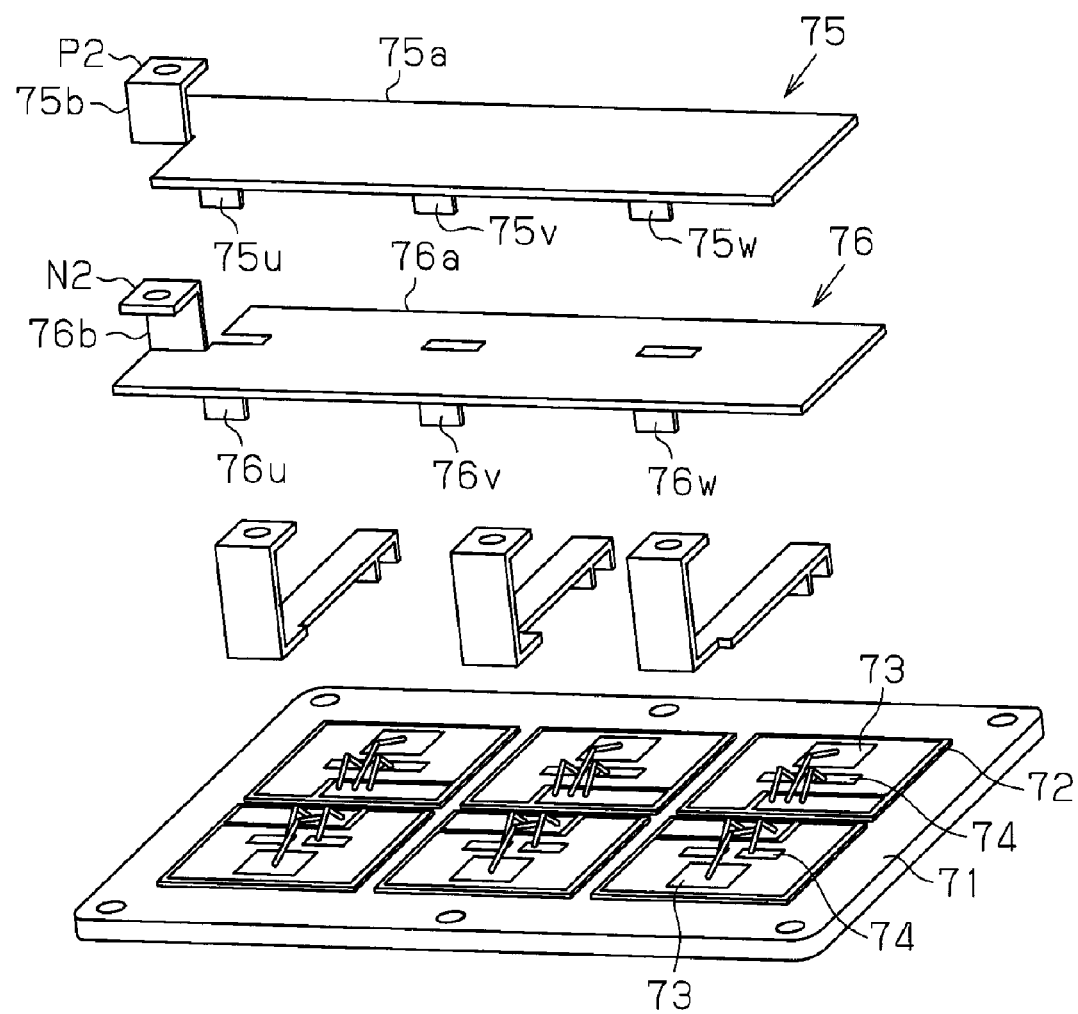
FIG. 14B is an exploded perspective view showing the power converter apparatus of FIG. 14A.

The circuit patterns 24*a*, 24*b*, 24*c*, 24*d* on the two ceramic substrates 21 that form an upper arm do not need to be arranged symmetrically with respect to a line extending between the two ceramic substrates 21, but may be arranged in the same manner as shown in FIG. 13. Likewise, the circuit patterns 24*a*, 24*b*, 24*c*, 24*d* on the two ceramic substrates 21 that form a lower arm do not need to be arranged symmetrically with respect to a line extending between the two ceramic substrates 21.

Instead of forming each arm by two ceramic substrates 21, each arm may be formed by one ceramic substrate 21. The structure in which each arm is formed by one ceramic substrate 21 eliminates the necessity of the wire bonding to electrically connect the gate signal circuit patterns 24*a* to each other and the source signal circuit patterns 24*d* to each other. Also, the number of joints between each drain circuit pattern 24*b* and the corresponding joint portions 27*b* of the positive interconnection member 27, and the number of joints between each source circuit pattern 24*c* and the corresponding joint portions 28*b* of the negative interconnection member 28 each may be reduced from two to one. Further, the number of joints between each drain circuit pattern 24*b* and the corresponding joint portions 35 of the output electrode members 32U, 32V, 32W, and the number of joints between each source circuit pattern 24*c* and the corresponding joint portions 35 of the output electrode members 32U, 32V, 32W each may be reduced from two to one. However, if the number of each joint is one, a jig for holding the capacitor assembly 38 and a jig for holding the output electrode members 32U, 32V, 32W are needed when performing ultrasonic bonding.

To be maintained in an upright state, each of the output electrode members 32U, 32V, 32W needs at least three joint portions 35.

The circuit patterns 24*a*, 24*b*, 24*c*, 24*d* do not necessarily have to be formed thin and parallel with each other. However, in the case where the circuit patterns 24*b*, 24*c* are shaped like blocks, a large area is required on each ceramic substrate 21 to secure a sufficient space for mounting a plurality of semiconductor chips 23 and for joining the joint portions 27*b*, 28*b* of the positive and negative interconnection members 27, 28 and the joint portions 35 of the output electrode members 32U, 32V, 32W. If the space between the circuit patterns 24*b*, 24*c* is narrow, it is difficult to join the output electrode members 32U, 32V, 32W by ultrasonic bonding while maintaining them in upright positions.

The single pair of the switching element and the diode does not need to be packaged as one semiconductor chip 23, but may be independently mounted on the circuit.

The juncture between the positive terminal 17*a* of the capacitor 17 and the positive interconnection member 27 the juncture between the negative terminal 17*b* and the negative interconnection member 28 are not limited to fastening by screws, but may be achieved by a joining method in which the capacitors 17 are less affected by heat than in soldering. For example, precision resistance welding or laser beam welding may be employed.

What is claimed:

1. A power converter apparatus comprising:
   a substrate on which a plurality of groups of switching elements are mounted, the switching elements in each group collectively function as a single switching element;
   a plate-like positive interconnection member and a plate-like negative interconnection member, which are arranged to be close to and parallel with each other, while being electrically insulated from each other; and
   a capacitor having a positive terminal electrically connected to the positive interconnection member and a negative terminal electrically connected to the negative interconnection member,
   wherein each of the positive interconnection member and the negative interconnection member has a terminal portion, the terminal portion having a joint portion that is electrically joined to a circuit pattern on the substrate, and
   wherein the switching elements are arranged in the same number on both sides of the joint portion of at least the positive interconnection member of the positive and negative interconnection members.

2. The power converter apparatus according to claim 1, wherein the positive and negative interconnection members are arranged to be parallel with and overlap the substrate,
   wherein the terminal portions extend toward the substrate from ends of each interconnection members in the widthwise direction, and the distal ends of the terminal portions are bent to extend parallel with the substrate, thereby forming the joint portions, and
   wherein the positions of the terminal portions are determined such that the positive and negative interconnection members can be mounted on the substrate in an upright state.

3. The power converter apparatus according to claim 2, wherein the each interconnection member is substantially symmetrical with respect to a line that passes through the center in the widthwise direction.

4. The power converter apparatus according to claim 3, wherein the capacitor is arranged on one of the positive and negative interconnection members that does not directly face the substrate, such that the positive and negative terminals face said one of the interconnection members.

5. The power converter apparatus according to claim 4, wherein the power converter apparatus is an inverter apparatus having a plurality of arms, each arm having switching elements the number of which is represented by 4N (where N is a natural number), and wherein, to each arm, the two joint portions of one of the positive and negative interconnection members are jointed.

6. The power converter apparatus according to claim 1, wherein the substrate includes a metal base and a plurality of insulated substrate joined onto the metal base, and wherein each insulated substrate includes an insulation layer facing the metal base and the circuit pattern formed on the insulation layer.

7. The power converter apparatus according to claim 1, further comprising an output electrode member having a joint portion that is electrically joined to the circuit pattern, wherein the switching elements are arranged in the same number on both sides of the joint portion of the output electrode member.

8. The power converter apparatus according to claim 1, further comprising an output electrode member having a joint portion that is electrically joined to the circuit pattern,
wherein the circuit pattern of the substrate includes a first area to which a drain or a collector of one of the switching elements is electrically connected, and a second area to which a source or an emitter of one of the switching elements is electrically connected,
wherein the first area includes a first portion to which at least one of the joint portion of the positive interconnection member and the joint portion of the output electrode member is connected,
wherein the second area includes a second portion to which at least one of the joint portion of the negative interconnection member and the joint portion of the output electrode member is connected, and
wherein the first portion and the second portion are arranged to be parallel with and adjacent to each other.

9. The power converter apparatus according to claim 8, wherein the first area and the second area are each formed like a belt, a plurality of the switching elements are mounted on the first area, and wherein a source or an emitter of one of the switching elements are connected to the second area by wire bonding.

10. The power converter apparatus according to claim 9, wherein the power converter apparatus is an inverter apparatus having a plurality of arms, each arm having switching elements the number of which is represented by 4N (where N is a natural number),
wherein, to each arm, the two joint portions of one of the positive and negative interconnection members and the two joint portions of the output electrode member are jointed, and
wherein 2N of the switching elements are mounted on the first area, to which the joint portion of the positive interconnection member is joined.

11. The power converter apparatus according to claim 9, wherein the positive and negative interconnection members are arranged to be parallel with and overlap the substrate,
wherein the terminal portions extend toward the substrate from ends of each interconnection members in the widthwise direction, and the distal ends of the terminal portions are bent to extend parallel with the substrate, thereby forming the joint portions, and
wherein the capacitor is arranged on one of the positive and negative interconnection members that does not directly face the substrate, such that the positive and negative terminals face said one of the interconnection members.

12. The power converter apparatus according to claim 1, wherein each joint portion is joined to one of the circuit patterns of the substrate by ultrasonic bonding.

* * * * *